(12) United States Patent
Chang et al.

(10) Patent No.: US 6,965,265 B2
(45) Date of Patent: Nov. 15, 2005

(54) DRIVING APPARATUS IN A LIQUID CRYSTAL DISPLAY

(75) Inventors: Wei-Hung Chang, Tainan (TW); Ming-Cheng Chiu, Tainan (TW)

(73) Assignee: Himax Technologies, Inc., Tainan (TW)

( * ) Notice: Subject to any disclaimer, the term of this patent is extended or adjusted under 35 U.S.C. 154(b) by 26 days.

(21) Appl. No.: 10/813,793

(22) Filed: Mar. 31, 2004

(65) Prior Publication Data

US 2005/0218975 A1 Oct. 6, 2005

(51) Int. Cl.⁷ .............................................. H03F 1/02
(52) U.S. Cl. .......................................... 330/9; 330/51
(58) Field of Search ............................ 330/51, 9, 269, 330/273, 264, 267; 327/112, 52, 107

(56) References Cited

U.S. PATENT DOCUMENTS 5,606,281 A * 2/1997 Gloaguen ..................... 330/51
5,841,321 A * 11/1998 Miyake et al. .............. 330/255
6,369,653 B1 * 4/2002 Kappes ........................ 330/267

* cited by examiner

*Primary Examiner*—Henry Choe
(74) *Attorney, Agent, or Firm*—Thomas, Kayden, Horstemeyer & Risley

(57) ABSTRACT

A driving apparatus for receiving an input voltage at an input terminal and generating an output voltage at an output terminal. The apparatus includes an output buffer electrically coupled between the input and output terminal, and an operational amplifier electrically coupled between the input and the output terminal, and selectively turned on to drive the output voltage to a voltage level substantially the same as the input voltage.

23 Claims, 6 Drawing Sheets

DRIVING APPARATUS IN A LIQUID CRYSTAL DISPLAY

BACKGROUND OF THE INVENTION

1. Field of the Invention

The present invention relates to a driving apparatus and particularly to a driving apparatus in the LCD.

2. Description of the Related Art

Since LCD panels are thinner in size and lower in power dissipation as compared with cathode-ray tube (CRT) panels, the LCD panels have recently been applied to personal computers, word processors, color telereceivers. Particularly, since active matrix-type LCD apparatuses have a high-speed response, a fine screen with a high quality, and a multi-gradation display, the active matrix-type LCD apparatuses have been in demand.

Generally, an active matrix-type LCD apparatus is constructed by a semiconductor substrate having thin film metal wire, a transparent pixel electrodes and thin-film transistors (TFTs), a counter substrate having a transparent common electrode, and liquid crystal inserted between the semiconductor substrate and the counter substrate. A gradation voltage is applied to each pixel electrode by controlling the TFT with a switching function, and transmittance of the liquid crystal is changed by the difference in voltage between each pixel electrode and the common electrode to provide display on the screen.

Provided on the semiconductor substrate are data lines for applying gradation voltages to the pixel electrodes and scan lines for applying switching control signals (scan signals) to the TFTs. Then, when the scan signal of the scan line is at a high level, all the TFTs connecting the scan line are turned ON, and the gradation voltages sent to the data line are applied to the pixel electrodes through the TFTs. When the scan signal becomes low to turn OFF the TFTs, the difference in voltage between each pixel electrode and the common electrode is maintained until the next gradation voltages are applied to the pixel electrodes. Thus, when scan signals are sequentially sent to each scan line, gradation voltages are applied to all the pixel electrodes, so that display on the screen is renewed at every frame period.

An LCD driving apparatus for driving the data lines, which called as a source driver, is required to charge/discharge a large load of each data line including a liquid crystal capacitance, wiring resistances and wiring capacitance.

An LCD driving apparatus is generally constructed by a voltage divider, a decoder and driver connected to a data line. Conventionally, the driver is implemented by operational amplifier (see: S. Saito et al., "A 6-bit Digital Data Printer for Color TFT-LCDs", SID 95 Digest, pp. 257–260, 1995). Since the operational amplifier has a high current supplying capability, the driver can drive the data line having a large capacitance load at a high speed. Additionally, even when the threshold voltages of transistors within the operational amplifier fluctuate slightly, the fluctuation of the output voltage of the operational amplifier is relatively small. In addition, the output voltage can be highly accurate.

In the prior art driver, however, the number of operational amplifiers with a large number of elements increases with the number of data lines. Therefore, if an LCD driving apparatus using the prior art driver is constructed in the form of a single integrated circuit device, the size of the integrated circuit device must be increased to accommodate enough operational amplifiers thereby increasing the manufacturing cost thereof. In addition, steady currents are required for the operational amplifiers, which increase the power dissipation.

SUMMARY OF THE INVENTION

The object of the present invention is to provide a LCD driving apparatus having a driver with low power dissipation.

The present invention provides a driving apparatus for receiving an input voltage at an input terminal and generating an output voltage at an output terminal. The apparatus includes an output buffer electrically coupled between the input and output terminal, and an operational amplifier electrically coupled between the input and the output terminal, and selectively turned on to drive the output voltage to a voltage level substantially the same as the input voltage.

The present invention provides another a driving apparatus for receiving an input voltage at an input terminal and generating an output voltage at an output terminal. The apparatus includes an output buffer receiving the input voltage and pulling the output voltage up to a first level higher than the input voltage during a first period, and an operational amplifier electrically coupled between the input and the output terminal, and selectively turned on to pull the output voltage down to a second level substantially the same as the input voltage during a second period after the first period.

The present invention provides still another driving apparatus for receiving an input voltage at an input terminal and generating an output voltage at an output terminal. The apparatus includes an output buffer receiving the input voltage and pulling the output voltage down to a first level lower than the input voltage during a first period, and an operational amplifier electrically coupled between the input and the output terminal, and selectively turned on to pull the output voltage up to a second level substantially the same as the input voltage during a second period after the first period.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
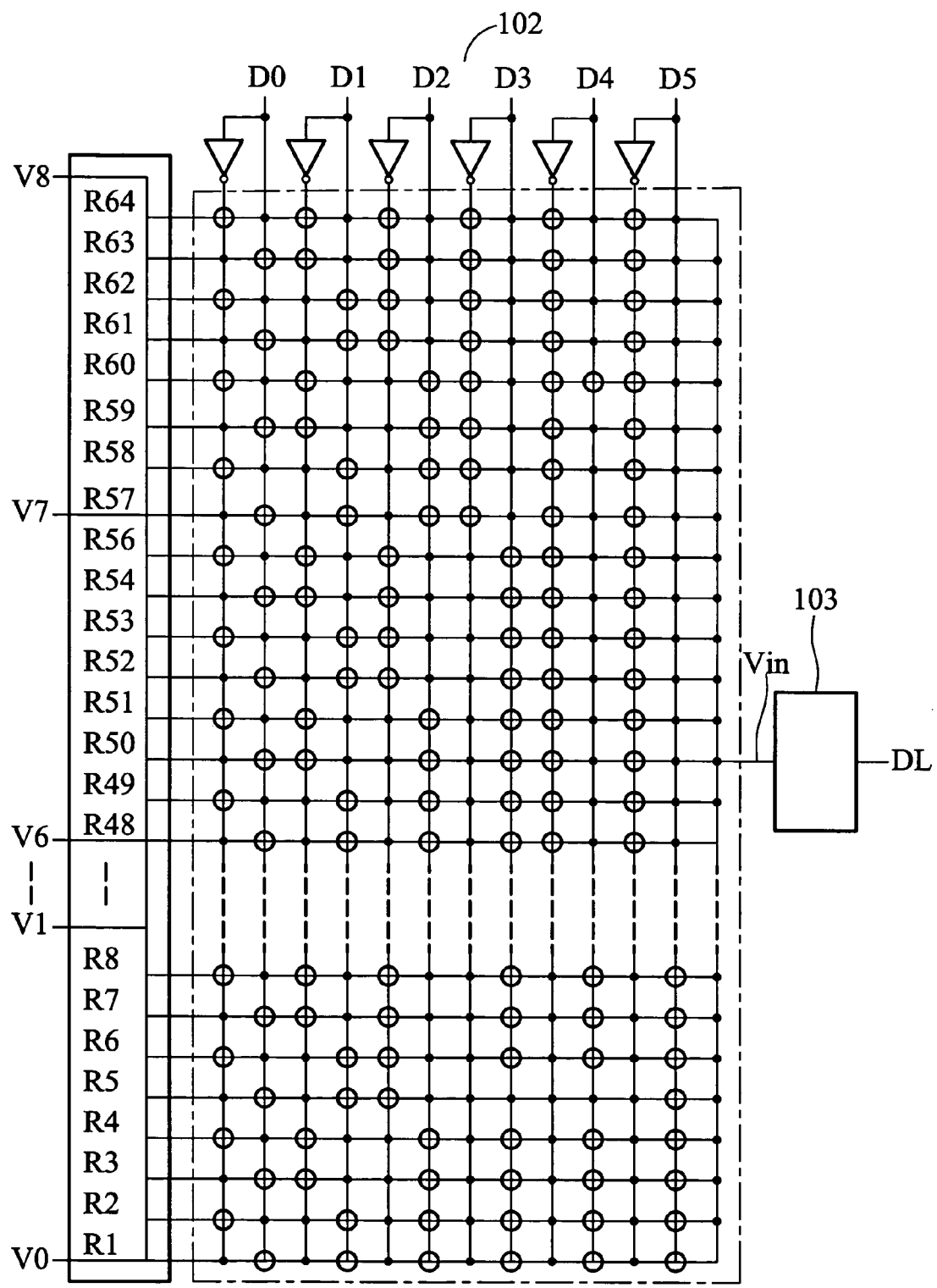
FIG. 1 shows an LCD driving apparatus according to one embodiment of the invention.

FIG. 1 shows a LCD driving apparatus according to one embodiment of the invention. The LCD driving apparatus generally includes a voltage divider 101, a decoder 102 and a driver 103 connected to a data line DL. The data line DL is also connected via TFTs (not shown) to pixel electrodes. The voltage divider 101 is formed by resistors R1, R2, . . . , R64 to generate multi-gradation voltages. The decoder 102 is formed by CMOS switches provided at intersections between lines connected to the resistors R1, R2, . . . , R64 and lines for reception of video data signals D0, D1, . . . , D5.

Figure 2:
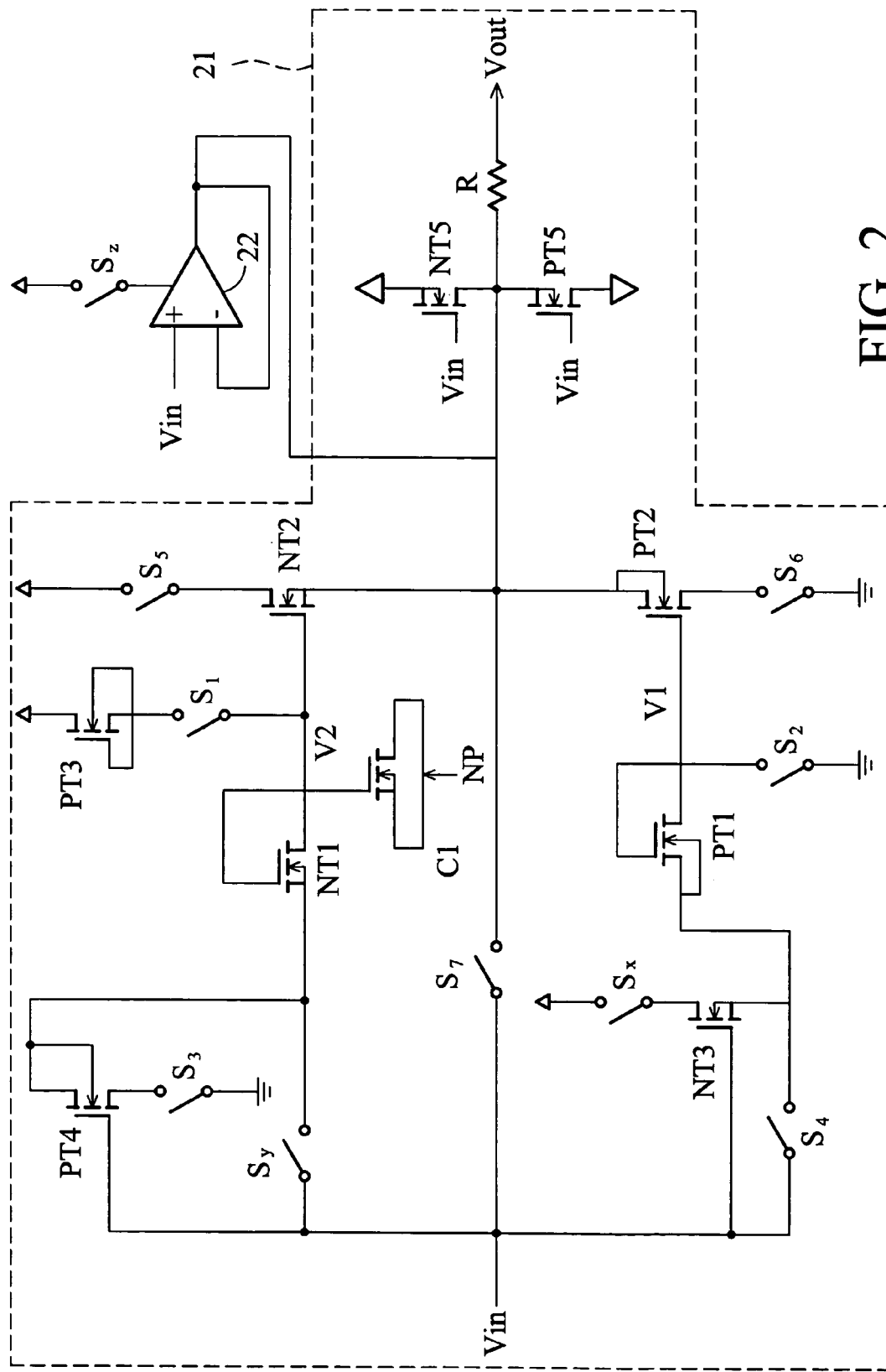
FIG. 2 shows the driver 103 of FIG. 1.

FIG. 2 shows the driver 103 of FIG. 1. It includes an output buffer 21 and an operational amplifier 22. The output buffer 21 receives the input voltage $V_{in}$ and outputs a voltage $V_{out}$ on the data line DL. The operational amplifier 22 has a positive input terminal receiving the input voltage Vin, a negative input terminal and an output terminal connected to the data line DL. The negative input and output terminals of the operational amplifier 22 are connected with each other. The operational amplifier 22 acts as a unit gain operational amplifier.

The output buffer 21 includes P-channel MOS transistors PT1, PT2, PT3, PT4 and PT5, N-channel MOS transistors NT1, NT2, NT3 and NT5, switches S1~S7, Sx and Sy, a capacitor C1 and a resistor R. The transistors PT1 and PT2 have gates commonly connected to a drain of the transistor PT1, and the transistor PT2 has a source connected to the data line DL through the resistor R. The transistor PT3 has a drain connected to receive a power supply voltage and a gate connected to the source of the transistor PT3. The transistor PT4 has a gate connected to receive the input voltage $V_{in}$ and a source connected to the source of the transistor NT1. The transistors NT1 and NT2 have a common gate connected to a drain of the transistor NT1, and the transistor NT2 has a source connected to the data line DL through the resistor R. The transistor NT3 has a gate connected to receive the input voltage $V_{in}$ and a source connected to the source of the transistor PT1. The transistor NT5 has a source connected to the data line DL through the resistor R, a drain connected to receive the power supply voltage, a gate connected to receive the input voltage $V_{in}$. The transistor PT5 has a source connected to the data line DL through the resistor R, a drain connected to receive the ground voltage, a gate connected to receive the input voltage $V_{in}$. The switch S1 is connected between the source of the transistor PT3 and the drain of the transistor NT1. The switch S2 has one end connected to receive a ground voltage and the other end connected to the drain of the transistor PT1. The switch S3 has one end connected to receive the ground voltage and the other end connected to the drain of the transistor PT4. The switch S4 has one end connected to receive the input voltage $V_{in}$ and the other end connected to the source of the transistor PT1. The switch S5 has one end connected to receive the power supply voltage and the other end connected to the drain of the transistor NT2. The switch S6 has one end connected to receive the ground voltage and the other end connected to the drain of the transistor PT2. The switch S7 has one end connected to receive the input voltage $V_{in}$ and the other end connected to the data line DL through the resistor R. The switch Sx has one end connected to receive the power supply voltage and the other end connected to the drain of the transistor NT3. The switch Sy has one end connected to receive the input voltage $V_{in}$ and the other end connected to the source of the transistor NT1. The capacitor C1 has one end connected to receive a control signal NP and the other end connected to the drain of the transistor NT1.

The driver of FIG. 2 operates in two different modes respectively when the input voltage $V_{in}$ is located between Gamma voltages V0 and V7, and V8 and V63, wherein V0 is higher voltage and V63 is lower voltage.

Figure 3A:
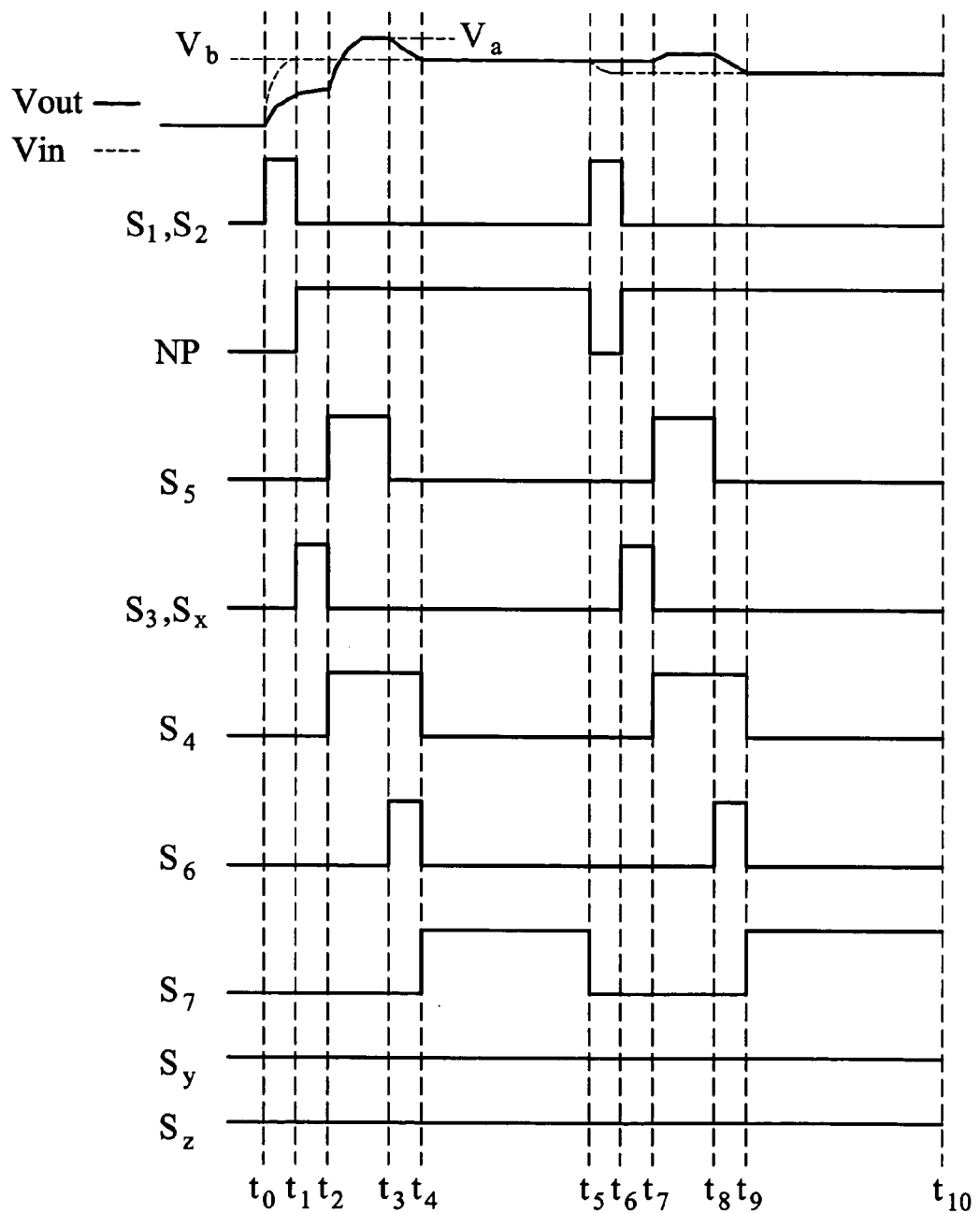
FIG. 3A~3D are diagrams showing the timing of the signals used in the driver of FIG. 2.

FIG. 3A is a diagram showing the signals of the driver operating in a first mode when the input voltage $V_{in}$ is located between Gamma voltages V0 and V7. The period from time t0 to t5 is one data output period while that from time t5 to t10 is another. The switches Sy and Sz are turned off when the driver operates in the first mode.

First, at time t0, the switches S1 and S2 are both turned ON. A bias voltage $V_1$ at the gates of the transistors PT1 and PT2 is 0 volt. Also, a bias voltage $V_2$ at the gates of the transistors NT1 and NT2 is $V_{DD}-V_{thp3}$ volt.

Next, at time t1, the switches S1 and S2 are turned OFF and the switch S3 and Sx are turned on. In addition, the control signal NP is at ON state to boost the voltage of the drain of the transistor NT1 on the level of the input voltage plus the threshold voltage of the transistor NT1 and the threshold voltage of the transistor PT4. The bias voltage $V_2$ becomes $$V_2 = V_{in} + V_{thn1} - V_{thp4}$$

Next, at time t2, the switches S3 and Sx are turned OFF and the switch S4 is turned on. Thus, the bias voltage $V_1$ becomes $$V_1 = V_{in} + V_{thp1}$$

In the meanwhile the switch SS is turned ON. In this state, since the transistor NT2 serves as a source follower, the output voltage $V_{out}$ becomes $$V_{out} = V_{in} + V_{thn1} + V_{thp4} - V_{thn2}$$

Therefore, if $V_{thn1}$ is similar to ($\fallingdotseq$) $V_{thn2}$, the output voltage $V_{out}$ is replaced by $$V_{out} \fallingdotseq V_{in} + V_{thp4}$$

Note that the maximum possible voltage level of ($V_{in}+V_{thp4}$) is the power supply voltage.

Next, at time t3, the switch S5 is turned OFF and the switch S6 is turned ON. In this state, since the transistor PT2 serves as a source follower, the output voltage $V_{out}$ becomes $$V_{out} = V_{in} + V_{thp1} - V_{thp2}$$

where $V_{thp2}$ is a threshold voltage of the transistor PT2. Therefore, if $V_{thp1}$ is similar to ($\fallingdotseq$) $V_{thp2}$, the output voltage $V_{out}$ is replaced by $$V_{out} \fallingdotseq V_{in}$$

It should be noted that, if the transistors PT1 and PT2 are formed closely to each other and their sizes are approximately the same as each other, the threshold voltages $V_{thp1}$ can be approximately the same as the threshold voltage $V_{thp2}$.

At time t4, the switch S7 is turned ON. Due to the poor driving capability of the source follower when $V_{out}$ is approaching $V_{in}$, the use of the switch S7 can reach the accurate optimum value (target value). Another reason of using the switch S7 is to compensate for the difference between the output voltage $V_{out}$ and its optimum value due to the difference in threshold voltage between the transistors NT1 and NT2. As previously described, at time t3, the output voltage $V_{out}$ is $V_{in}+V_{thn1}-V_{thn2}$. If there is a significant difference between $V_{thn1}$ and $V_{thn2}$, the output voltage $V_{out}$ deviates by $\Delta V$ from its optimum value, i.e., $V_{in}$. Next, at time t4, the switches S5 and S6 are both turned OFF and the switch S7 is turned ON, respectively, so that the output voltage $V_{out}$ will be averaged by source outputs with the same gray output voltage and will eventually become equal to the input voltage $V_{in}$ since $\Delta V$ is small if the time is long enough. Even the S7 period is not long, each source output with the same gray output can still be averaged, and the $\Delta V$ from it's optimum value can be offset cancelled by opposite polarity since the source output in the opposite polarity would be at the same order offset from it's optimum value. Thus, by turning on S7, the accuracy of the output voltage $V_{out}$ is enhanced.

It should be noted that the transistors NT5 and PT5 are used for charging and discharging source output for the first step to approach the target value. With the aid of the transistors NT5 and PT5, the source output can be operated more accurate.

In other manner, it is not required to turn off the switches S6 at time t4. The switch S6 can be kept turning on for a while after time t4 (not shown).

The operation during the first data output period from time t0 to t5 is repeated during the second data output period from time t5 to t10.

Figure 3B:
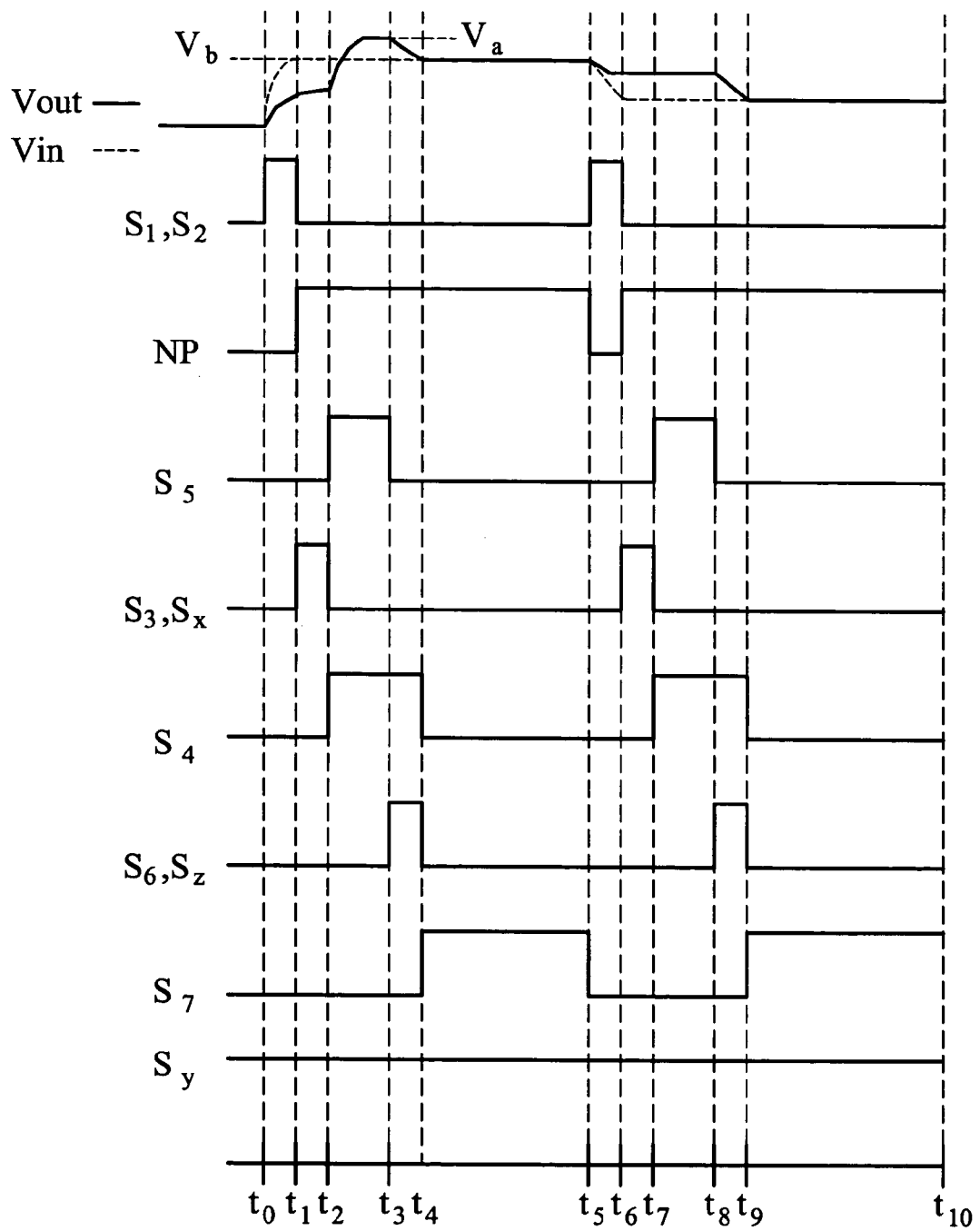

FIG. 3B is a diagram showing the signals of the driver operating in a second mode when the input voltage $V_{in}$ is located between Gamma voltages V8 and V63. The operations of the driver in the second mode is similar to that in the first mode except that the switch Sz is turned on and off simultaneously with the switch S6. This results in activation of the operational amplifier 22 which helps to pull down the output voltage $V_{out}$.

In other manner, it is not required to turn on/off the switches S6 and Sz simultaneously. The switch Sz can be turned on after the switch S6 turning on (not shown) or turned off before the switch S6 turning off (not shown).

The driver of FIG. 2 can be operated in two other different modes respectively when the input voltage $V_{in}$ is located between Gamma voltages V56 and V63, and V0 and V55.

Figure 3C:
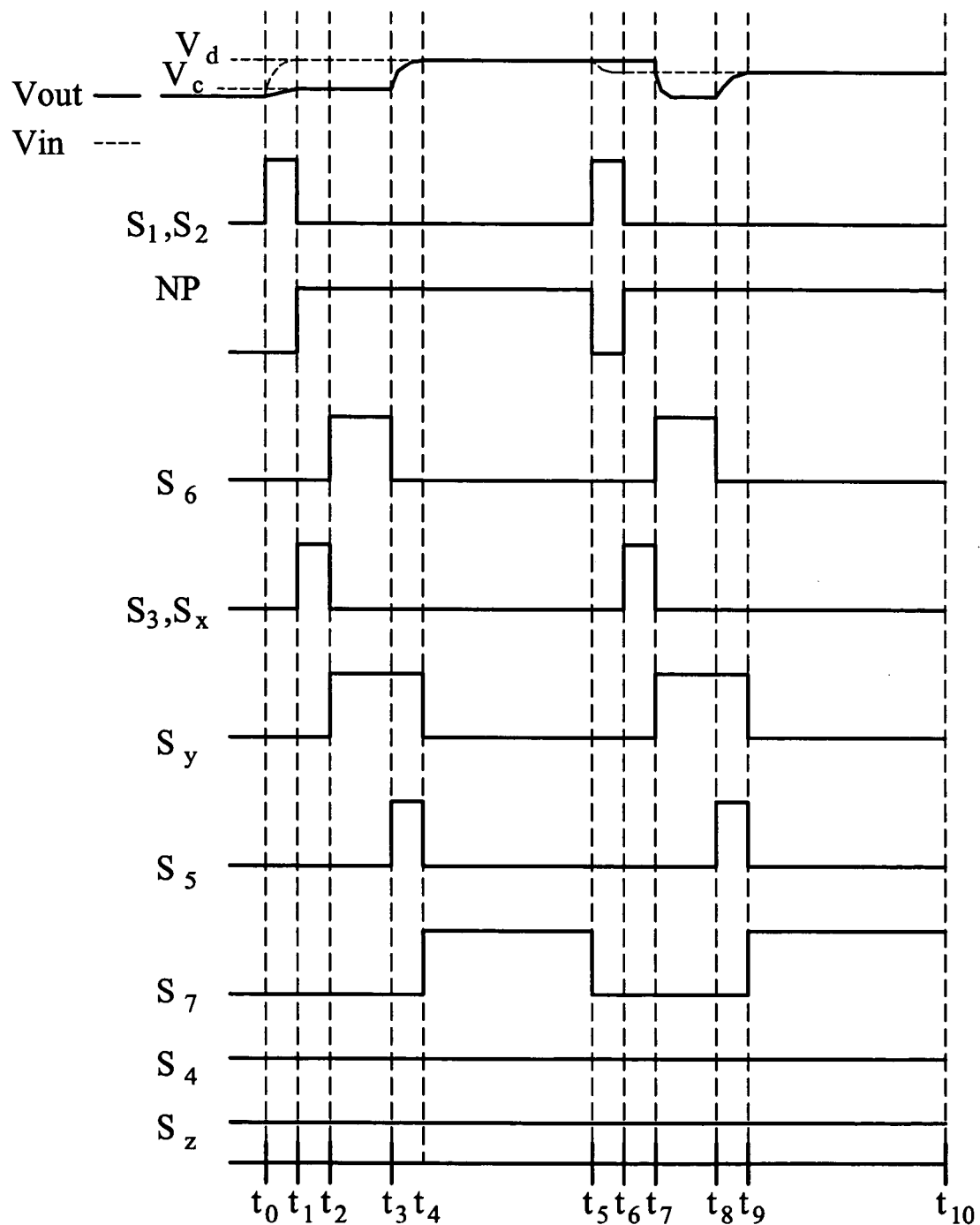

FIG. 3C is a diagram showing the signals of the driver operating in a third mode when the input voltage $V_{in}$ is located between Gamma voltages V56 and V63. The switches S4 and Sz are turned OFF when the driver operates in the third mode.

First, at time t0, the switches S1 and S2 are both turned ON. A bias voltage $V_1$ at the gates of the transistors PT1 and PT2 is 0 volt. Also, a bias voltage $V_2$ at the gates of the transistors NT1 and NT2 is $V_{DD}-V_{thp3}$ volt.

Next, at time t1, the switches S1 and S2 are turned OFF and the switches S3 and Sx are turned on. In addition, the control signal NP is at ON state to boost the voltage of the drain of the transistor NT1 on the level of the input voltage plus the threshold voltage of the transistor NT1 and the threshold voltage of the transistor PT4.

Next, at time t2, the switch S4 is turned ON and the bias voltages $V_{1\ and\ V2}$ become $$V_1 = V_{in} + + V_{thp1} - V_{thn3}$$

$$V_2 = V_{in} + V_{thn1}$$

At the same time, the switch S6 is turned ON. In this state, since the transistor PT2 serves as a source follower, the output voltage $V_{out}$ becomes $$V_{out} = V_{in} + V_{thp1} - V_{thn3} - V_{thp2}$$

where $V_{thp2}$ is a threshold voltage of the transistor PT2.

Therefore, if $V_{thp1}$ is similar to ($\doteq$) $V_{thp2}$, the output voltage $V_{out}$ is replaced by $$V_{out} \doteq V_{in} - V_{thn3}$$

Note that, if the transistors PT1 and PT2 are formed closely to each other and their sizes are approximately the same as each other, the threshold voltages $V_{thp1}$ can be approximately the same as the threshold voltage $V_{thp2}$.

Next, at time t3, the switches S5 is turned ON. In this state, since the transistor NT2 serves as a source follower, the output voltage $V_{out}$ becomes $$V_{out} = V_{in} + V_{thn1} - V_{thn2}$$

where $V_{thn2}$ is a threshold voltage of the transistor NT2.

Therefore, if $V_{thn1}$ is similar to ($\doteq$) $V_{thn2}$, the output voltage $V_{out}$ is replaced by $$V_{out} \doteq V_{in}$$

Finally, at time t4, the switch S7 is turned ON until time t5. The operation during the first data output period from time t0 to t5 is repeated during the second data output period from time t5 to t10.

In other manner, it is not required to turn off the switches S5 at time t4. The switch S5 can be kept turning on for a while after time t4 (not shown).

Figure 3D:
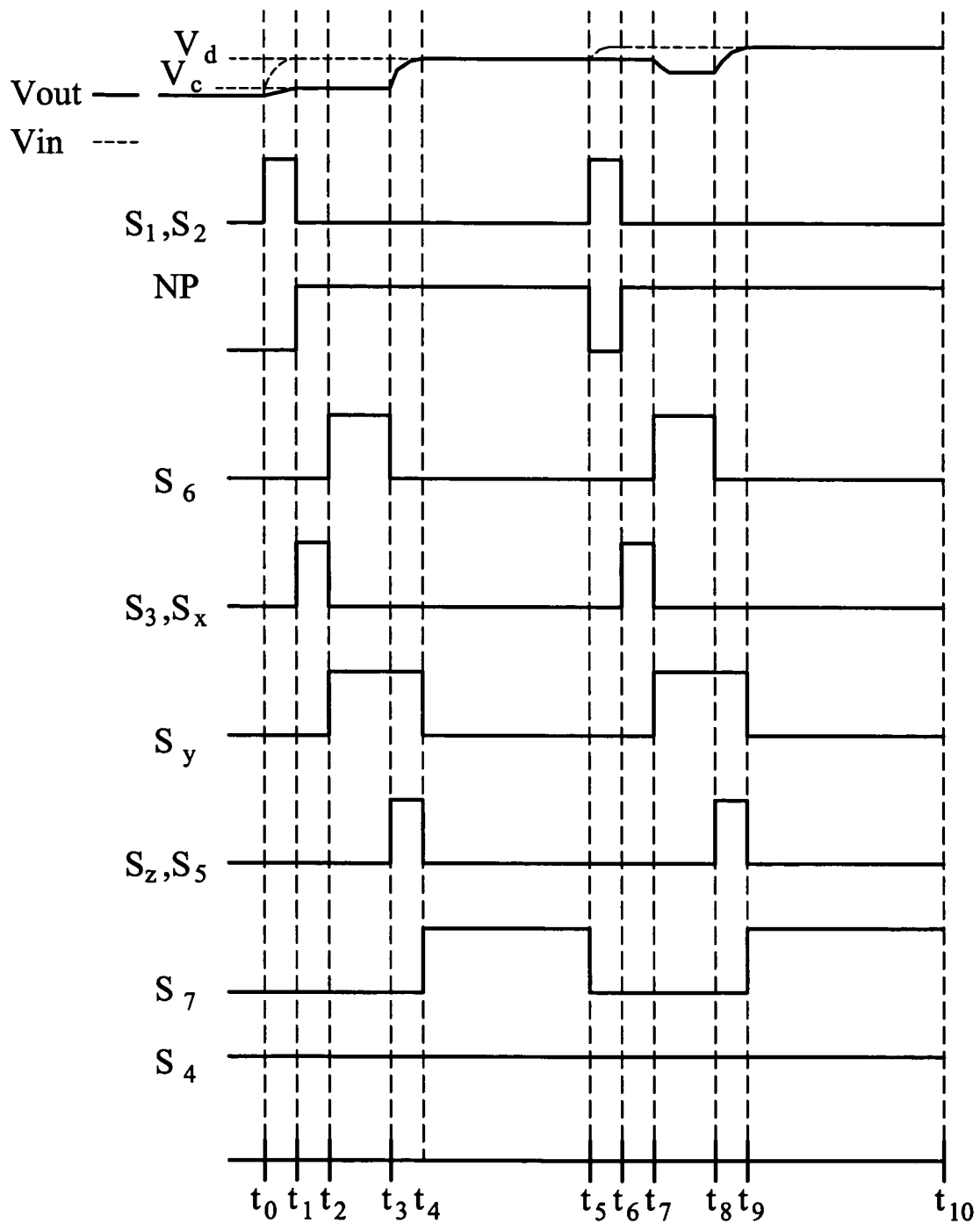

FIG. 3D is a diagram showing the signals of the driver operating in a fourth mode when the input voltage $V_{in}$ is located between Gamma voltages V0 and V55. The operations of the driver in the fourth mode is similar to that in the third mode except that the switch Sz is turned on and off simultaneously with the switch S5. This results in activation of the operational amplifier 22 which helps to pull up the output voltage $V_{out}$.

In other manner, it is not required to turn on/off the switches S5 and Sz simultaneously. The switch Sz can be turned on after the switch S5 turning on (not shown) or turned off before the switch S5 turning off (not shown).

In the previously described driver 103, the output buffer 21 mainly includes a bias circuit, a source follower and a short circuit. The bias circuit is composed of the transistors PT1, PT3, PT4, NT1 and NT3, and the capacitor C1. By control of the switches S1~S4, Sx and Sy, the bias circuit is activated during the period from t0 to t2 for generation of bias voltages. The transistor NT2 and/or PT2 serves as the source follower. By control of the switches S5 or S6, the source follower is activated and biased by the bias voltages during the period from time t2 to t3, activated during the period from time t3 to t4, and inactivated after time t4. In the first and second mode, the activation of the source follower pulls the output voltage $V_{out}$ up to a level Va higher than the input voltage $V_{in}$. In the third and fourth mode, the activation of the source follower pulls the output voltage $V_{out}$ down to a level Vc lower than the input voltage $V_{in}$. The short circuit is composed of the switch S7 and activated during the period from time t4 to t5 for connection of the input and output terminals. The operational amplifier 22 is turned off during the whole data output period when the input voltage $V_{in}$ is higher than the Gamma voltage V8 (the first mode) or lower than the Gamma voltage V55 (the third mode). When the input voltage $V_{in}$ is located between the Gamma voltages V8 and V63 (the second mode), the operational amplifier 22 is turned on during the period from time t3 to t4, which drives (pulls down) the output voltage $V_{out}$ from Va to a voltage level Vb substantially the same as the input voltage. When the input voltage $V_{in}$ is located between the Gamma voltages V0 and V55 (the fourth mode), the operational amplifier 22 is turned on during the period from time t3 to t4, which drives (pulls up) the output voltage $V_{out}$ from Vc to a voltage level Vd substantially the same as the input voltage. The operational amplifier may be an unit gain operational amplifier.

In the first and second modes of the above preferred embodiment of this invention, output buffer pulls the output voltage to a level higher than the input voltage and then drive the output voltage to a level substantial the same as the input voltage. The operational amplifier pulls down or drives the output voltage to a level substantial the same as the input voltage either during a part of or after the activation of the output buffer.

In the third and fourth modes of the above preferred embodiment of this invention, output buffer pulls the output voltage to a level lower than the input voltage and then drive the output voltage to a level substantial the same as the input voltage. The operational amplifier pulls up or drives the output voltage to a level substantial the same as the input voltage either during a part of or after the activation of the output buffer.

The previously described driver applies to an positive input voltage $V_{in}$. However, for an input voltage $V_{in}$ having negative level during the data output period, the source driver may be modified by exchanging the types of the NMOS and PMOS transistors, and the polarities of the power supply voltages.

In conclusion, the present invention provides a LCD driving apparatus having a source driver with low power dissipation. The source drive includes an output buffer and operational amplifier. The operational amplifier is turned on for only a short period of time to help pull the output voltage up or down. This reduces the power dissipated by the operational amplifier.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A driving apparatus for receiving an input voltage at an input terminal and generating an output voltage at an output terminal, comprising:
   an output buffer electrically coupled between the input and output terminal; and
   an operational amplifier electrically coupled between the input and the output terminal, and selectively turned on to drive the output voltage to a voltage level substantially the same as the input voltage.

2. The driving apparatus as claimed in claim 1, wherein the operational amplifier is turned off when a level of the input voltage is higher than a predetermined threshold.

3. The driving apparatus as claimed in claim 1, wherein the operational amplifier is turned off when a level of the input voltage is lower than a predetermined threshold.

4. The driving apparatus as claimed in claim 1, wherein the output buffer comprises:
   a bias circuit activated during a first period to generate bias voltages; and
   a source follower activated and biased by the bias voltages during a second period after the first period, and inactivated during a third period after the second period.

5. The driving apparatus as claimed in claim 4, wherein the operational amplifier is turned on during the third period.

6. The driving apparatus as claimed in claim 4, wherein the operational amplifier is turned on during a part of the second period.

7. The driving apparatus as claimed in claim 4, wherein the output buffer further comprises a short circuit for selectively shorting the input terminal and the output terminal.

8. The driving apparatus as claimed in claim 7, wherein the short circuit is activated during a fourth period after the third period.

9. The driving apparatus as claimed in claim 1, wherein the operational amplifier is an unit gain operational amplifier.

10. A driving apparatus for receiving an input voltage at an input terminal and generating an output voltage at an output terminal, comprising:
    an output buffer receiving the input voltage and pulling the output voltage up to a first level higher than the input voltage during a first period; and
    an operational amplifier electrically coupled between the input and the output terminal, and selectively turned on to pull the output voltage down to a second level substantially the same as the input voltage during a second period after the first period.

11. The driving apparatus as claimed in claim 10, wherein the operational amplifier is turned off when a level of the input voltage is higher than a predetermined threshold.

12. The driving apparatus as claimed in claim 10, wherein the operational amplifier is turned off when a level of the input voltage is lower than a predetermined threshold.

13. The driving apparatus as claimed in claim 10, wherein the output buffer comprises:
    a bias circuit activated during a third period before the first period to generate bias voltages; and
    a source follower activated and biased by the bias voltages during the first period.

14. The driving apparatus as claimed in claim 13, wherein the output buffer further comprises a short circuit for selectively shorting the input terminal and the output terminal.

15. The driving apparatus as claimed in claim 14, wherein the short circuit is activated during a fourth period after the second period.

16. The driving apparatus as claimed in claim 10, wherein the operational amplifier is an unit gain operational amplifier.

17. A driving apparatus for receiving an input voltage at an input terminal and generating an output voltage at an output terminal, comprising:
    an output buffer receiving the input voltage and pulling the output voltage down to a first level lower than the input voltage during a first period; and
    an operational amplifier electrically coupled between the input and the output terminal, and selectively turned on to pull the output voltage up to a second level substantially the same as the input voltage during a second period after the first period.

18. The driving apparatus as claimed in claim 17, wherein the operational amplifier is turned off when a level of the input voltage is lower than a predetermined threshold.

19. The driving apparatus as claimed in claim 17, wherein the operational amplifier is turned off when a level of the input voltage is higher than a predetermined threshold.

20. The driving apparatus as claimed in claim 17, wherein the output buffer comprises:
    a bias circuit activated during a third period before the first period to generate bias voltages; and
    a source follower activated and biased by the bias voltages during the first period.

21. The driving apparatus as claimed in claim 20, wherein the output buffer further comprises a short circuit for selectively shorting the input terminal and the output terminal.

22. The driving apparatus as claimed in claim 21, wherein the short circuit is activated during a fourth period after the second period.

23. The driving apparatus as claimed in claim 17, wherein the operational amplifier is an unit gain operational amplifier.

* * * * *